United States Patent
Kwon (10) Patent No.: US 7,286,415 B2
(45) Date of Patent: Oct. 23, 2007

(54) SEMICONDUCTOR MEMORY DEVICES HAVING A DUAL PORT MODE AND METHODS OF OPERATING THE SAME

(75) Inventor: Kee-Won Kwon, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 22 days.

(21) Appl. No.: 11/258,766

(22) Filed: Oct. 26, 2005

(65) Prior Publication Data

US 2006/0098519 A1    May 11, 2006

(30) Foreign Application Priority Data

Nov. 10, 2004    (KR) .................. 10-2004-0091223

(51) Int. Cl.
*G11C 7/10*    (2006.01)
*G11C 8/00*    (2006.01)

(52) U.S. Cl. .................. 365/189.04; 365/189.02; 365/230.05; 365/233

(58) Field of Classification Search ............ 365/189.04
See application file for complete search history.

(56) References Cited

U.S. PATENT DOCUMENTS

| | | | | |
|---|---|---|---|---|
| 4,698,753 A | * | 10/1987 | Hubbins et al. ............ | 709/209 |
| 5,454,095 A | * | 9/1995 | Kraemer et al. ............ | 701/104 |
| 5,502,822 A | * | 3/1996 | Takebe ..................... | 710/316 |
| 5,587,953 A | * | 12/1996 | Chung ..................... | 365/220 |
| 5,659,711 A | * | 8/1997 | Sugita ...................... | 711/144 |
| 5,671,393 A | * | 9/1997 | Yamaki et al. ............. | 711/150 |
| 6,794,891 B2 | * | 9/2004 | Ichikawa .................. | 324/765 |
| 6,950,911 B2 | * | 9/2005 | Cohen et al. .............. | 711/150 |
| 2005/0066067 A1 | * | 3/2005 | Suh .......................... | 710/1 |
| 2006/0171239 A1 | * | 8/2006 | Balasubramanian et al. ..... | 365/230.05 |

FOREIGN PATENT DOCUMENTS

| | | |
|---|---|---|
| JP | 64-055794 | 3/1989 |
| JP | 2002-312233 | 10/2002 |
| KR | 1020020050092 A | 6/2002 |
| KR | 10-2004-0059235 | 7/2004 |

OTHER PUBLICATIONS

Notice to Submit a Response for Korean Patent Application No. 10-2004-0091223 mailed on May 2, 2006.

* cited by examiner

*Primary Examiner*—Son L. Mai
(74) *Attorney, Agent, or Firm*—Myers Bigel Sibley & Sajovec

(57) ABSTRACT

A memory device having a dual port function includes a memory cell array and a switching unit. The memory cell array has a first port and a second port. The switching unit assigns first data received through a data bus to the first port in response to a leading edge of a clock signal and assigns second data received through the data bus to the second port in response to a trailing edge of the clock. Methods of operating memory devices having a dual port mode are also disclosed.

15 Claims, 7 Drawing Sheets

SEMICONDUCTOR MEMORY DEVICES HAVING A DUAL PORT MODE AND METHODS OF OPERATING THE SAME

CROSS-REFERENCE TO RELATED APPLICATION

This application claims priority under 35 U.S.C. § 119 to Korean Patent Application No. 10-2004-0091223 filed on Nov. 10, 2004, the disclosure of which is hereby incorporated herein by reference as if set forth in its entirety.

FIELD OF THE INVENTION

The present invention relates to semiconductor memory devices, and more particularly, to semiconductor memory devices having a dual port mode and methods of operating memory devices in a dual port mode.

BACKGROUND

Various sub-blocks of a central processing unit (CPU) used in mobile computing devices such as, for example, mobile telephones, personal digital assistants (PDAs), portable music players, and the like, may require access to a memory device.

Specifically, in order to perform a large number of functions efficiently, the CPU of a mobile computing device may include various associated sub-blocks, such as a baseband processing block, a game-related processing block, a camera-related processing block, a music-related processing block, and/or other processing blocks. In order to simultaneously perform two or more functions, such as to simultaneously perform a music function and a game function, and/or to simultaneously perform a call function and a camera function, the corresponding sub-blocks may need to simultaneously access a memory device.

A memory device may be designed to have multiple ports so as to accommodate multiple memory accesses, thereby enhancing the overall system performance. Specifically, when two sub-blocks simultaneously access the memory device, the memory device may have I/O data pins and address/command pins for each of the two sub-blocks.

In that case, the total number of I/O pins coupled to the memory device may increase and the power consumption of the system may increase accordingly.

SUMMARY

A memory device according to some embodiments of the invention includes a switching unit configured to assign data received through a data bus to a first port in response to a leading edge of a clock signal and configured to assign the received data to a second port in response to a trailing edge of the clock signal. A memory device according to embodiments of the invention further includes a first path through which first data assigned to the first port are transmitted, a second path through which second data assigned to the second port are transmitted, and a memory cell array configured to store the first data and the second data transmitted respectively through the first path and the second path.

To perform a write operation, the switching unit may be configured to provide a write command and/or an address received through a command/address bus to the first path in response to the leading edge of the clock signal and to assign the data received through the data bus to the first port in response to the leading edge of the clock signal. The switching unit may be configured to provide a write command and/or an address received through a command/address bus to the second path in response to the trailing edge of the clock signal and to assign the data received through the data bus to the second port in response to the trailing edge of the clock signal.

To perform a read operation, the switching unit may be configured to provide the first data to the data bus through the first path in response to the leading edge of the clock signal. The switching unit may be further configured to provide the second data to the data bus through the second path in response to the trailing edge of the clock signal.

In some embodiments of the invention, the switching unit may be configured to selectively adjust frequencies of assigning the data to the first port and the second port on the basis of a first bandwidth and a second bandwidth provided for the first port and the second port, respectively. The switching unit may further be configured to adjust a first frequency of assigning the data to the first port to be larger than a second frequency of assigning the data to the second port, when the first bandwidth is larger than the second bandwidth.

The switching unit may be configured to receive a control signal indicative of a single port mode and/or a dual port mode, and the switching unit may be further configured to assign the data to the first port and the second port in response to the leading edge and the trailing edge of the clock signal, respectively, when the control signal is indicative of the dual port mode.

A memory device according to further embodiments of the invention includes a switching unit configured to switch a data bus to a first path in response to a leading edge of a clock signal and configured to switch the data bus to a second path in response to a trailing edge of the clock signal, and a memory cell array coupled to the first path and the second path and configured to store the data received from the first and second paths.

According to some embodiments of the invention, a memory device configured to communicate with a control unit is provided. In particular, the memory device includes a command/address bus configured to receive a command and/or an address from the control unit, a data bus configured to communicate data with the control unit, a clock signal pin configured to receive a clock signal from the control unit, and a switching unit configured to assign data received through the data bus to a first port in response to a leading edge of the clock signal and to assign the received data to a second port in response to a trailing edge of the clock signal. The device further includes a first path through which first data assigned to the first port are transmitted, a second path through which second data assigned to the second port are transmitted, and a memory cell array configured to store the first data and the second data received respectively through the first path and the second path.

The memory device may further include a control pin for receiving a control signal indicative of a single port mode and/or a dual port mode.

Methods of operating a memory device in a dual port mode according to some embodiments of the invention include assigning data received through a data bus to a first port in response to a leading edge of a clock signal and assigning the received data to a second port in response to a trailing edge of the clock signal when requests to access the memory device are received from at least two controllers, providing first data assigned to the first port to a memory cell array via a first path, and providing second data assigned to the second port to the memory cell array via a second path.

Assigning data to the first port may include providing a write command and/or an address received through a command/address bus to the first path in response to the leading edge of the clock signal in a write operation. Assigning data to the second port may include providing a write command and/or an address received through a command/address bus to the second path in response to the trailing edge of the clock signal in a write operation.

In particular embodiments of the invention, assigning data to the first and second ports may include adjusting frequencies of assigning the data to the first port and the second port on the basis of a first bandwidth and a second bandwidth respectively at the first port and the second port. Assigning data to the first and second ports may include adjusting a first frequency of assigning the data to the first port to be larger than a second frequency of assigning the data to the second port when the first bandwidth is larger than the second bandwidth.

Methods of operating a memory device in a dual port mode according to further embodiments of the invention include assigning first data stored in a memory cell array to a first port in response to a leading edge of a clock signal and assigning second data stored in the memory cell array to a second port in response to a trailing edge of the clock signal when requests to access the memory cell array are received from at least two controllers, providing the first data received from the first port to a data bus via a first path, and providing the second data received from the second port to the data bus via a second path.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION OF EMBODIMENTS OF THE INVENTION

Hereinafter, embodiments of the present invention will be described with reference to the accompanying drawings.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

A semiconductor memory device having a dual port function according to some embodiments of the present invention may be advantageously employed in electronic devices that include a plurality of logic circuits that are mounted on a single semiconductor chip and may request simultaneous access to a memory. Some embodiments of the invention may be particularly useful in devices having multiple processing blocks, such as, for example mobile telephones and/or other mobile computing devices.

Figure 1:
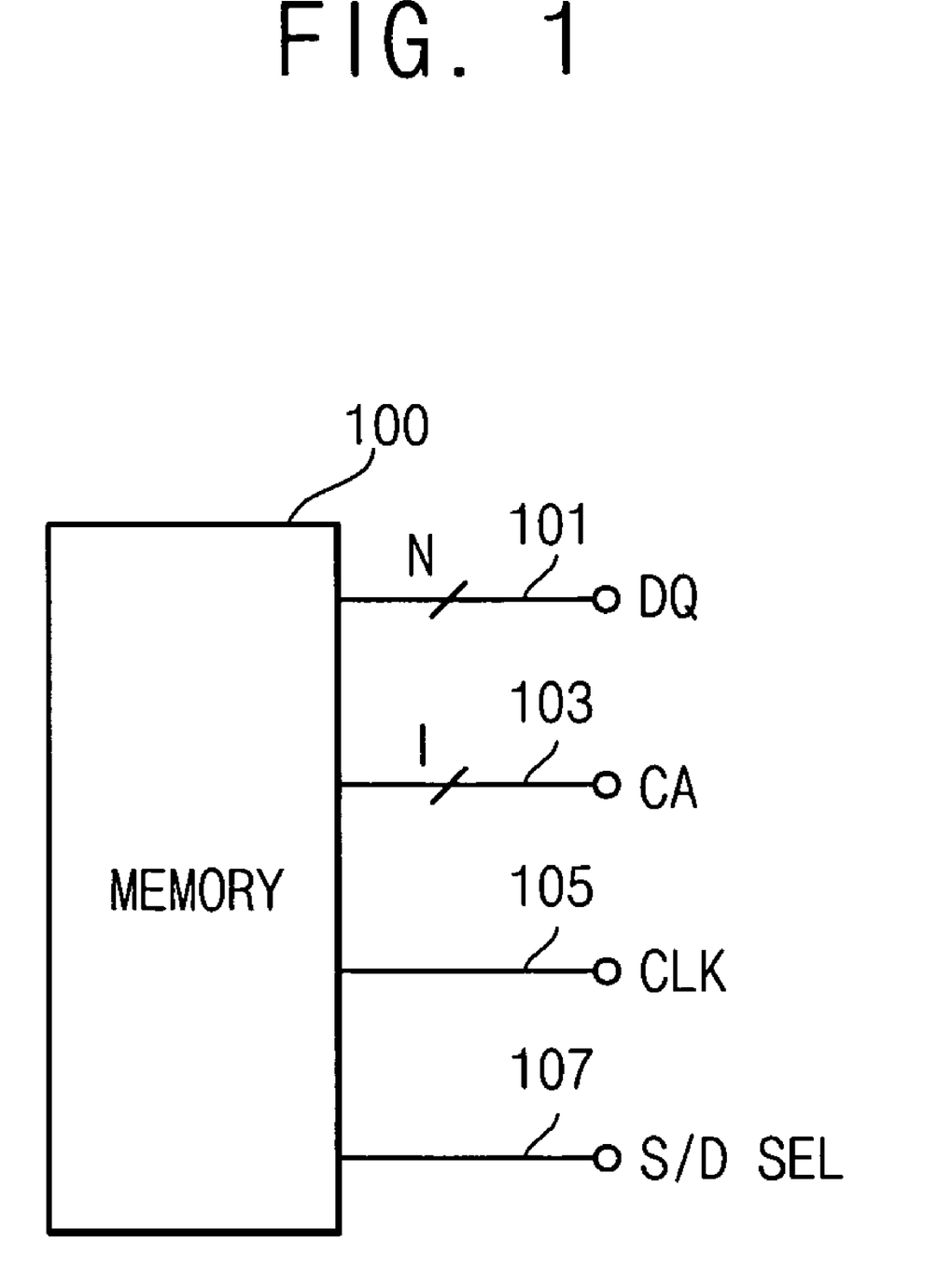
FIG. 1 is a block diagram of a memory device having a dual port function according to some embodiments of the present invention.

FIG. 1 is a block diagram of a memory device having a dual port function according to some embodiments of the present invention.

Figure 2:
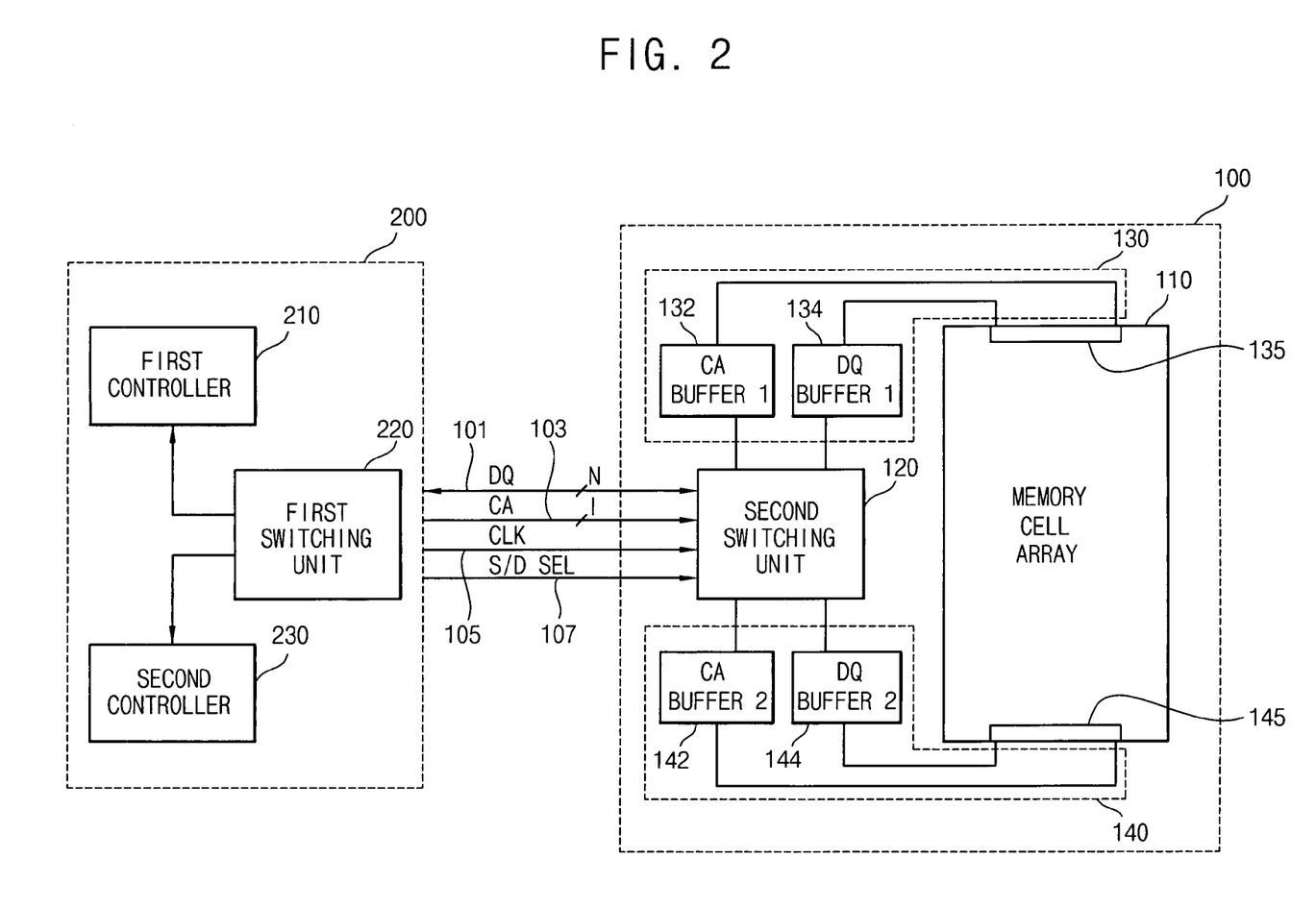
FIG. 2 is a block diagram illustrating a memory device having a dual port function and an associated control unit according to some embodiments of the present invention.

Referring to the embodiments of FIG. 1, a memory device 100 includes a data (DQ) bus 101, a command/address (CA) bus 103, a clock (CLK) pin 105, and a control (S/D SEL) pin 107. In some embodiments, the data bus 101 and/or the command/address bus 103 may include a serial data bus and/or a parallel data bus. In particular embodiments, the data bus 101 may include an n-line parallel data bus and the command/address bus 103 may include an i-line parallel data bus as indicated in FIG. 2. The pin and/or bus lines described herein, and the terminology used to describe such pin and/or bus lines, are provided as examples only. Other pins and/or bus lines may be used to communicate data and/or command information to/from the memory device 100.

In performing a write operation and/or a read operation, data may be communicated between the memory device 100 and at least one external control unit through the DQ bus 101.

Various commands associated with a read operation and/or a write operation and/or an address signal may be transmitted from the external control unit to the memory device 100 through the CA bus 103.

A clock signal is transmitted to the memory device 100 through the CLK pin 105.

The memory device 100 according to an example embodiment of the present invention has a structure similar to the structure of a single port memory device except that the memory device 100 may receive a control signal S/D SEL indicative of a given port mode, for example, a single port mode, a dual port mode, etc., through the S/D SEL pin 107.

The memory device 100 may include, for example, a DRAM (Dynamic Random Access Memory), an SRAM (Static RAM), a flash memory, and/or other types of memory devices.

The external control unit may include, for example, a baseband block for processing baseband signals, a game-related processing block (hereinafter simply referred to as "game block"), a camera-related processing block (hereinafter simply referred to as "camera block"), a music-related processing block (hereinafter simply referred to as "music block"), and/or other types of processing blocks.

For example, in order to simultaneously perform a music function and a game function, the music block and the game block may simultaneously request access to the memory device 100. Likewise, in order to simultaneously perform a call function and a camera function, the baseband block and the camera block may simultaneously request access to the memory device 100.

In such a situation, commands, addresses, data, and clocks may be transmitted from two associated blocks (e.g., the music block and the game block) to the memory device 100 through one DQ bus 101, one CA bus 103 and one CLK pin 105, and/or data may be transmitted from the memory device 100 to the blocks through one DQ bus 101.

FIG. 2 is a block diagram illustrating a memory device 100 having a dual port function and an associated control unit 200 according to some embodiments of the present invention.

Referring to the embodiments of FIG. 2, the control unit 200 includes a first controller 210, a second controller 230, and a first switching unit 220. A memory device 100 includes a memory cell array 110, a second switching unit 120, a first path 130, and a second path 140. The first path 130 includes a first CA buffer (CA BUFFER 1) 132 and a first DQ buffer (DQ BUFFER 1) 134, and the second path 140 includes a second CA buffer (CA BUFFER 2) 142 and a second DQ buffer (DQ BUFFER 2) 144. The control unit 200 may include more than two controllers, and the memory device 100 may include more than two paths to provide a memory device operating substantially similar to a memory device having three or more ports. However, the discussion of the embodiments of FIG. 2 is directed to a memory device having a dual-port mode for purposes of brevity.

The first switching unit 220 receives a request for access to the memory device 100 from at least one of the first controller 210 and/or the second controller 230. When the first switching unit 220 receives simultaneous memory access requests from both the first controller 210 and the second controller 230 (e.g. if the first controller 210 makes a request for memory access while the switching unit 220 is processing a request for memory access from the second controller 220, or vice-versa, or if memory requests are initiated by the first controller 210 and the second controller 220 in the same clock cycle), the first switching unit 220 generates and provides a control signal S/D SEL indicating, for example, a dual port mode to the second switching unit 120 through an S/D SEL pin 107. Unless simultaneous memory access requests are received from the first controller 210 and the second controller 230, the first switching unit 220 generates and provides a control signal S/D SEL indicating a single port mode to the second switching unit 120 through the S/D SEL pin 107.

The first switching unit 220 may be implemented, for example, as a multiplexer and/or a demultiplexer.

The control unit 200 may be a central processing unit (CPU) of, for example, a computing device such as a mobile phone. The first controller (or first processor) 210 or the second controller (or second processor) 230 may be any one of a baseband block for processing baseband communication signals, a game block for processing associated game function, a camera block for processing associated camera function, a music block for processing associated music function, etc.

The control unit 200 transmits commands and/or addresses needed to access the memory device 100 from the first controller 210 and the second controller 230 to the memory device 100 through a CA bus 103. In addition, the control unit 200 transmits data generated from the first controller 210 and the second controller 230 to the memory device 100 through a DQ bus 101.

The second switching unit 120 receives data, commands/addresses, clocks, and control signals from the control unit 200 respectively through the DQ bus 101, the CA bus 103, a CLK pin 105, and the S/D SEL pin 107. When the control signal S/D SEL indicates the single port mode, the second switching unit 120 latches and provides the data, the command and/or the address bits to the memory cell array 110 through the first path 130 or the second path 140 in response to a rising edge (or a falling edge) of the clock signal.

When the control signal S/D SEL indicates the dual port mode, the second switching unit 120 latches and assigns the data, the command and/or the address bits to one of a first port 135 and/or a second port 145 through the first path 130 and the second path 140, respectively. For example, the data, command and/or address bits may be assigned to a first port 135 and transmitted through the first path 130 to the memory cell array 110 in response to a rising edge (or a falling edge) of the clock signal. In addition, the data, the command and/or the address bits may be assigned to a second port 145 and transmitted through the second path 140 to the memory cell array 110 in response to a falling edge (or a rising edge) of the clock signal.

Specifically, in a write operation, when the control signal S/D SEL indicates the dual port mode, the second switching unit 120 latches and provides write commands and addresses received through the CA bus 103 to the first CA buffer (CA BUFFER 1) 132 in response to a rising edge (or a falling edge) of the clock signal, and provides data received through the DQ bus 101 to the first DQ buffer (DQ BUFFER 1) 134 in response to a rising edge (or a falling edge) of the clock signal. In addition, in a write operation, when the control signal S/D SEL indicates the dual port mode, the second switching unit 120 latches and provides write commands and addresses received through the CA bus 103 to the second CA buffer 142 (CA BUFFER 2) in response to a falling edge (or a rising edge) of the clock signal, and provides data received through the DQ bus 101 to the second DQ buffer (DQ BUFFER 2) 144 in response to a falling edge (or a rising edge) of the clock signal.

The second switching unit 120 may adjust the frequencies of assigning the data to the first and second ports 135, 145, on the basis of the bandwidths required at the first and second ports 135, 145. For example, when the bandwidth required at the first port 135 is larger than the bandwidth required at the second port 145, the second switching unit 120 may adjust the frequency of assigning the data to the first port 135 to be larger than the frequency of assigning the data to the second port 145.

Specifically, in a read operation, when the control signal S/D SEL indicates the dual port mode, the second switching unit 120 may read data from the memory cell array 110 through the first DQ buffer 134 of the first path 130 corresponding to the first port 135, and may output the read data to the DQ bus 101 in response to a rising edge (or a falling edge) of the clock signal. In addition, in the read operation, when the control signal S/D SEL indicates the dual port mode, the second switching unit 120 may read data from the memory cell array 110 through the second DQ buffer 144 of the second path 140 corresponding to the second port 145, and may output the read data to the DQ bus 101 in response to a falling edge (or a rising edge) of the clock signal.

The first controller 210 and the second controller 230 may request to write data and/or to read data to/from the memory device 100 simultaneously. Alternatively, the first controller 210 may request to write data to the memory device 100, while the second controller 230 requests to read data from the memory device 100, or vice-versa.

Figure 3:
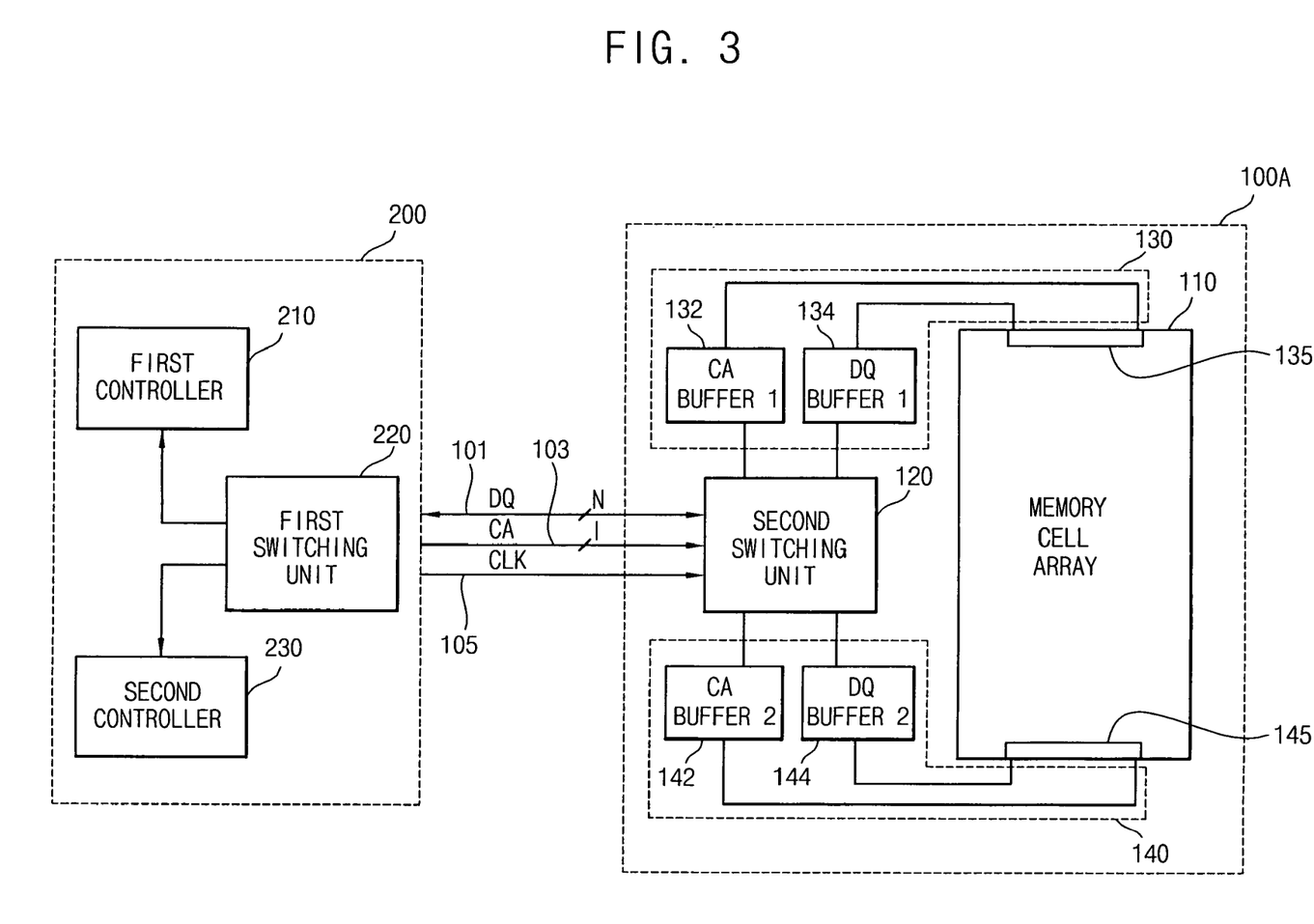
FIG. 3 is a block diagram illustrating a memory device having a dual port function and an associated control unit according to further embodiments of the present invention.

FIG. 3 is a block diagram illustrating a memory device having a dual port function and an associated control unit according to further embodiments of the present invention.

As illustrated in FIG. 3, unlike the example embodiment illustrated in FIG. 2, a memory device 100A for performing the dual port function may not include the S/D SEL pin 107 for receiving the control signal S/D SEL indicating the single port mode or the dual port mode.

Figure 4:
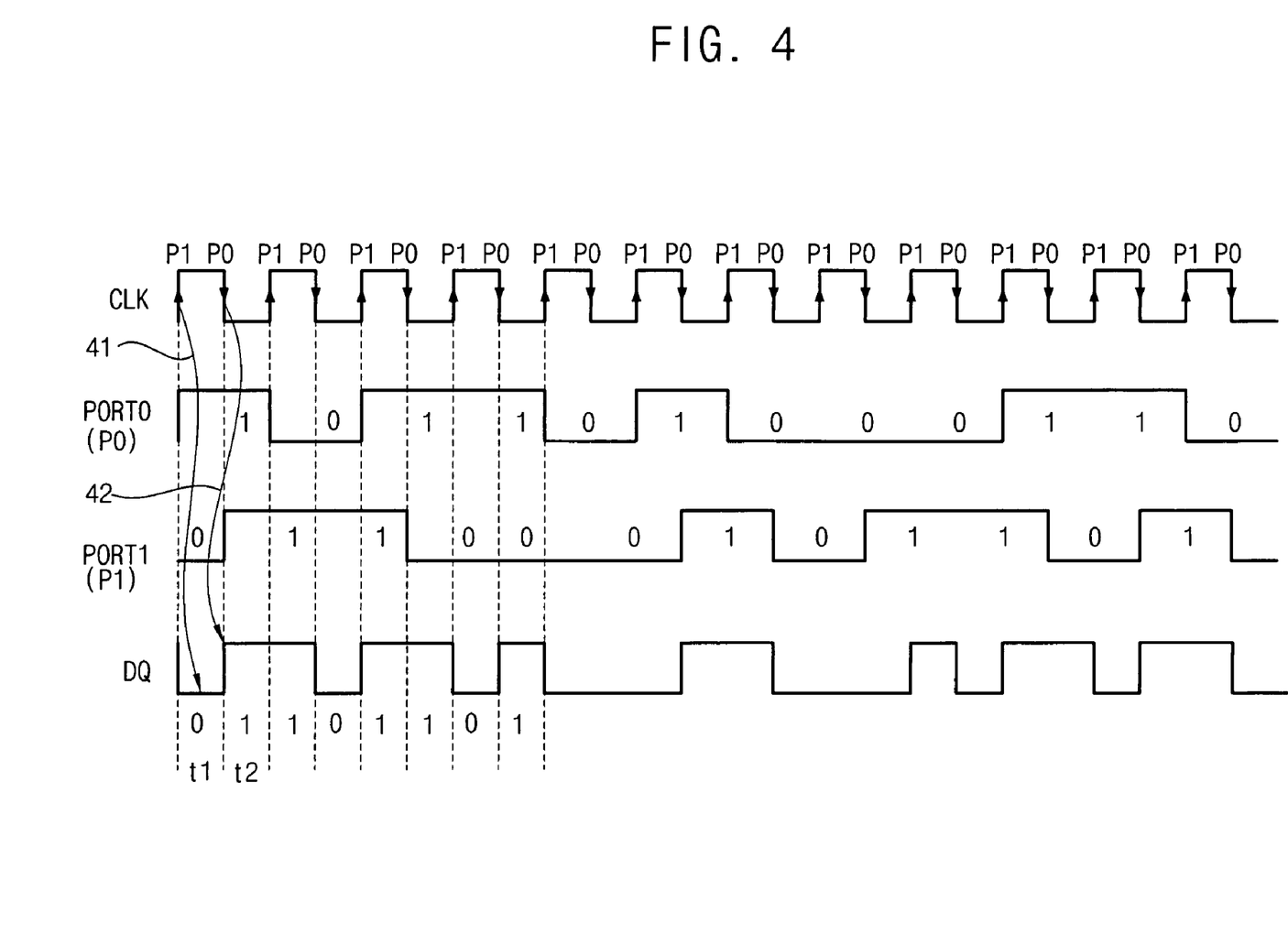
FIG. 4 is a timing diagram illustrating operations of the memory device of FIG. 1 according to some embodiments of the present invention.

FIG. 4 is a timing diagram illustrating operations of the memory device in FIG. 1 according to some embodiments of the present invention.

Referring to FIG. 4, data (or command/address bits) may be assigned alternately to a first port P0 and a second port P1 in response to a falling edge and a rising edge of the clock CLK, respectively.

For example, the dual port function may be implemented by assigning data (or command/address bits) to the first port P0 in response to a falling edge of a clock while assigning data (or command/address bits) to the second port P1 in response to a rising edge of the clock.

Specifically, in a write operation, data having logic "0" may be output from the DQ bus 101 to the second port P1 during a period t1 in response to the rising edge of the clock CLK (arrow 41), and data having logic "1" may be output from the DQ bus 101 to the first port P0 during a period t2 in response to the falling edge of the clock CLK (arrow 42).

In a read operation, data having logic "0" may be output from the second port P1 to the DQ bus 101 during the period t1 in response to the rising edge of the clock CLK, and data having logic "1" may be output from the first port P0 to the DQ bus 101 during the period t2 in response to the falling edge of the clock CLK.

In a similar manner, the command (or the address) received from the CA bus 103 may be assigned to the first and/or second ports P0 and P1.

Figure 5:
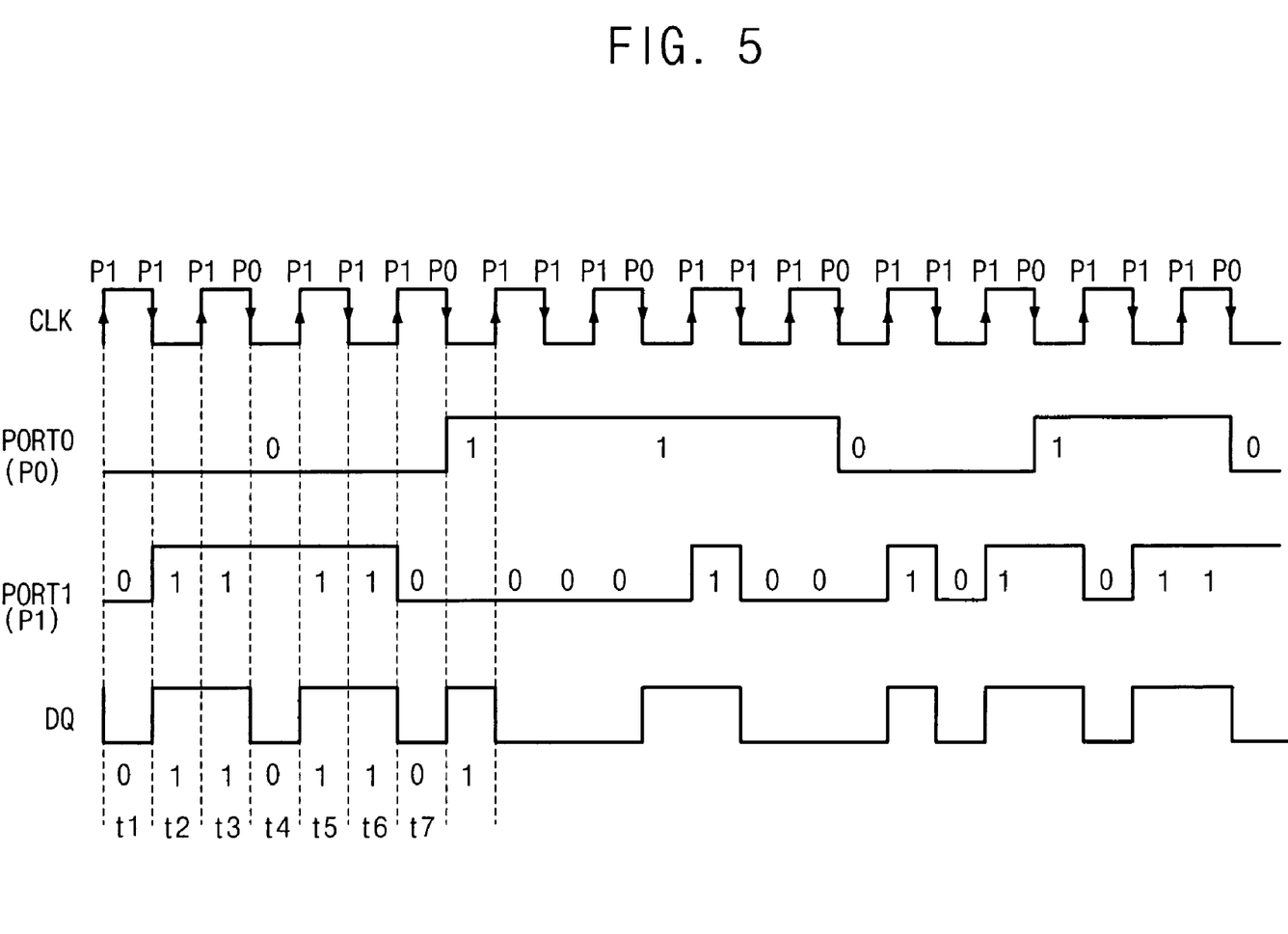
FIG. 5 is a timing diagram illustrating operations of the memory device of FIG. 1 according to further embodiments of the present invention.

FIG. 5 is a timing diagram illustrating operations of the memory device in FIG. 1 according to further embodiments of the present invention.

Referring to FIG. 5, when the bandwidth required at the second port P1 is, for example, three times the bandwidth required at the first port P0, data (or command/address bits) may be assigned, for example, to the first and second ports P0 and P1 in an order that follows the pattern P1-P1-P1-P0-P1-P1-P1-P0 in response to the falling and rising edges of the clock signal CLK. When the bandwidth required at the second port P1 is, for example, two times the bandwidth required at the first port P0, data may be assigned, for example, to the ports in an order that follows the pattern P1-P1-P0-P1-P1-P0 in response to the falling and rising edges of the clock signal CLK.

Specifically, in a write operation, when data (or command/address bits) are assigned to the first and second ports P0 and P1 in an order that follows the pattern P1-P1-P1-P0-P1-P1-P1-P0, data respectively having logic "0", "1" and "1" may be sequentially output from the DQ bus 101 to the second port P1 during corresponding clock periods t1, t2 and t3 responsive to consecutive rising, falling and rising edges of the clock CLK. Data having logic "0" may be output from the DQ bus 101 to the first port P0 during a clock period t4 responsive to the next falling edge of the clock CLK.

In the read operation, data (or command/address bits) may be read from the ports in an order that follows the pattern P1-P1-P1-P0-P1-P1-P1-P0, and data respectively having logic "0", "1" and "1" may be sequentially output from the second port P1 during the clock periods t1, t2 and t3. Also, data having logic "0" may be output from the first port P0 to the DQ bus 101 during the clock period t4.

Figure 6:
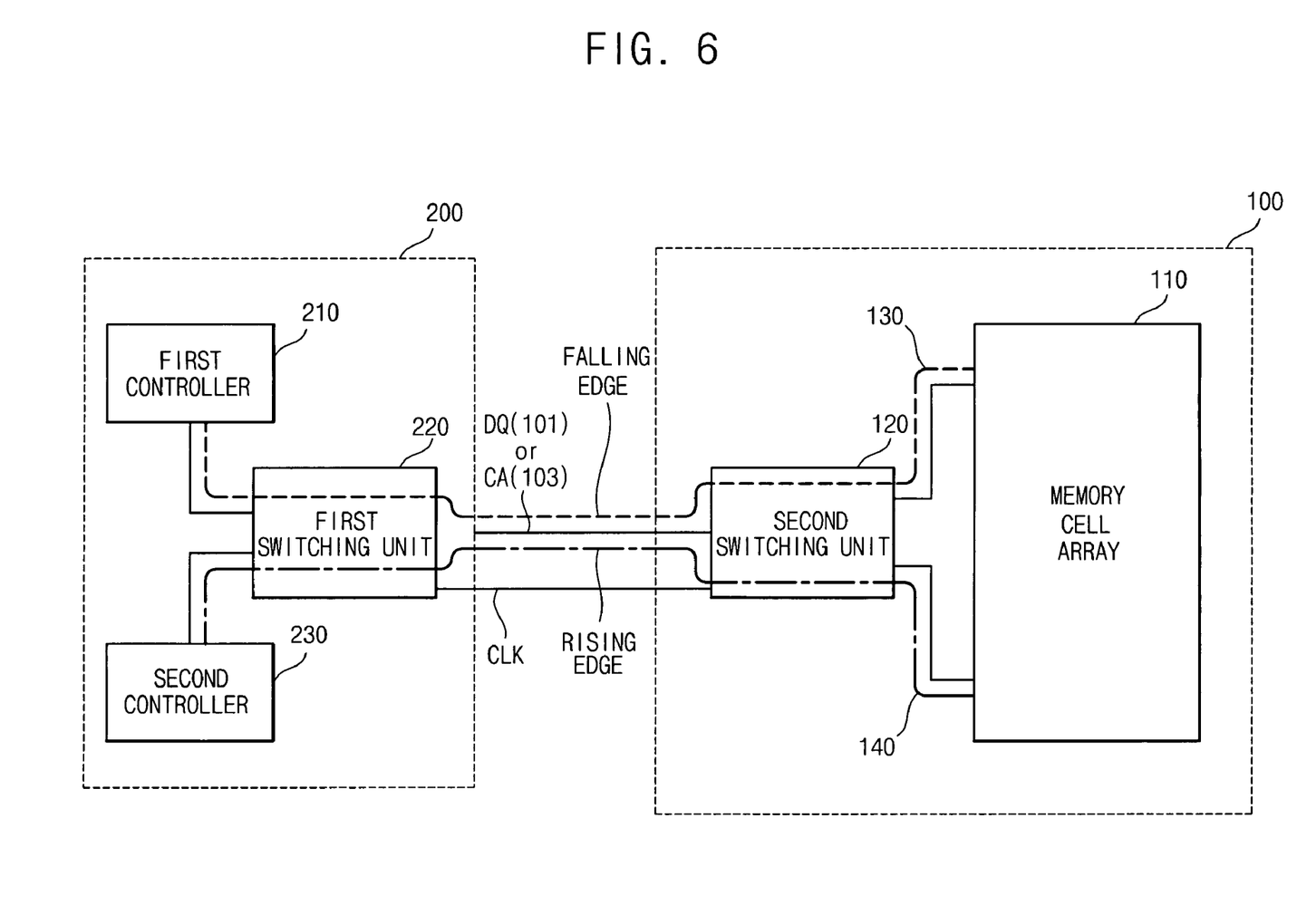
FIG. 6 is a block diagram illustrating operations of accessing a memory device having a dual port function according to some embodiments of the present invention.

FIG. 6 is a block diagram illustrating operations of accessing a memory device having a dual port function according to some embodiments of the present invention.

Referring to the embodiments of FIG. 6, when the first controller 210 and the second controller 230 simultaneously request access to the memory device 100 to perform a write operation, the memory device 100 may receive data (or command/address bits) from the first controller 210 through the DQ bus 101 (or the CA bus 103) in response to the falling edge of the clock CLK to store the received data in the memory cell array 110 via the first path 130. And, the memory device 100 may receive data (or command/address bits) from the second controller 230 through the DQ bus 101 (or the CA bus 103) in response to the rising edge of the clock CLK to store the received data in the memory cell array 110 via the second path 140.

Similarly, when the first controller 210 and the second controller 230 simultaneously request an access to the memory device 100 to perform a read operation, the memory device 100 may output data read from the memory cell array 110 through the first path 130 to the DQ bus 101 (or the CA bus 103) in response to the falling edge of the clock. The read data may be transferred to the first controller 210. And, the memory device 100 may output data read from the memory cell array 110 through the second path 140 to the DQ bus 101 (or the CA bus 103) in response to the rising edge of the clock. The read data may be transferred to the second controller 230.

Figure 7:
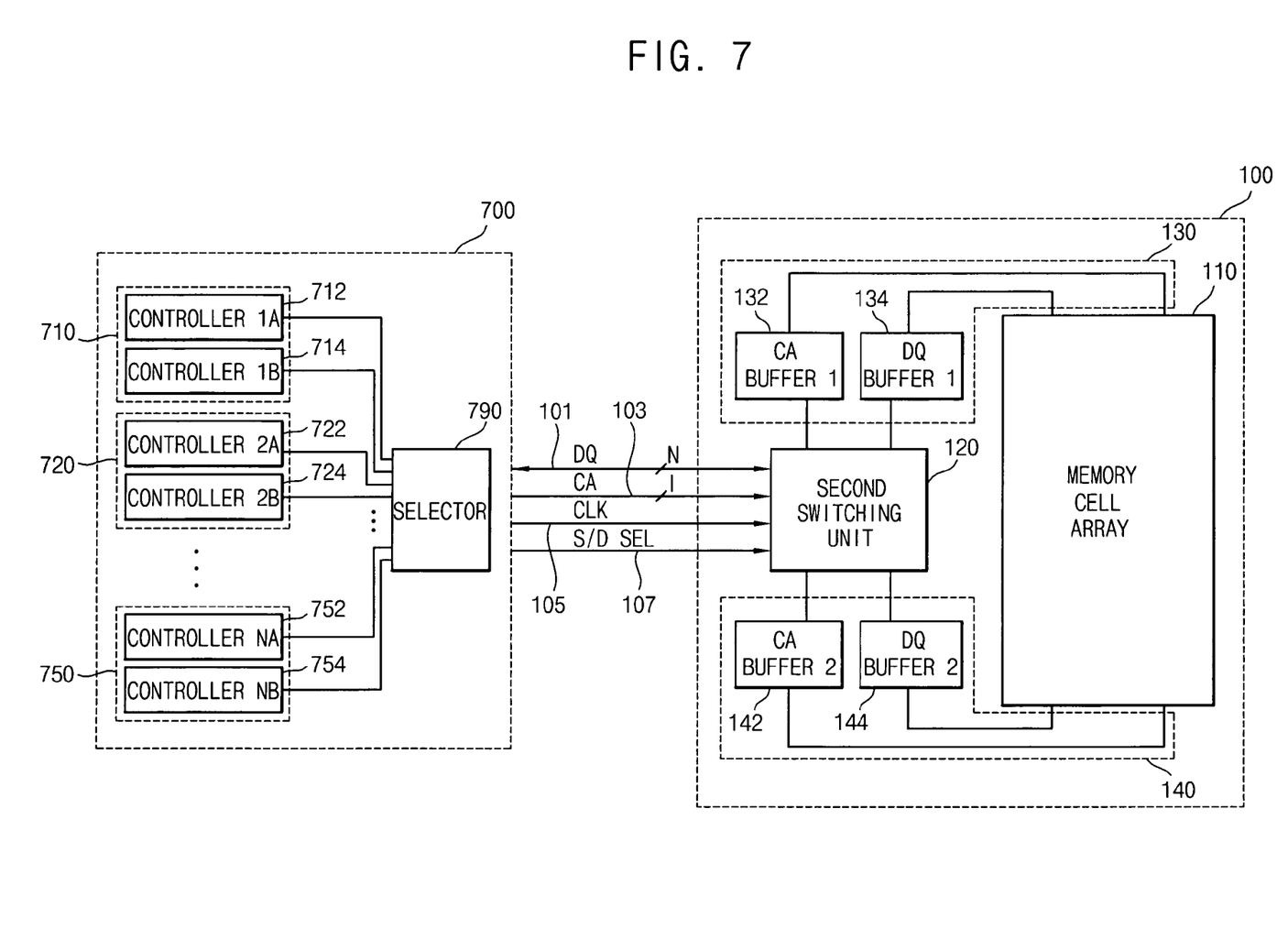
FIG. 7 is a block diagram illustrating a memory device having a dual port function and an associated control unit according to further embodiments of the present invention.

FIG. 7 is a block diagram illustrating a memory device having a dual port function and a control unit thereof according to further embodiments of the present invention.

Referring to FIG. 7, a control unit 700 includes a first controller block 710, a second controller block 720, . . . , an Nth controller block 750. The controller blocks 710, 720, . . . , 750 each may include two controllers, e.g., 712 and 714, 722 and 724, ..., 752 and 754, respectively. For example, a respective controller may correspond to a baseband processing block, a game processing block, a camera processing block, a music processing block, and/or another type of processing block.

A selector 790 receives a memory access request from the respective controllers 712 and 714, 722 and 724, ..., 752 and 754 and transmits data and commands/addresses from the requesting controllers to the memory device 100 respectively through the DQ bus 101 and/or the CA bus 103.

In some embodiments, a pair of two controllers having a high possibility of simultaneously accessing the memory device 100 may be paired in one controller block. For example, a controller for control of processing associated with a music block and another controller for control of processing associated with a camera may constitute one controller block. Alternatively or in addition, a controller for control of processing associated with a game block and another controller for control of processing associated with a music block may constitute one controller block.

The structure and operation of the memory device 100 of FIG. 7 may be the same as those in the foregoing embodiments and thus a detailed description thereof may be omitted for conciseness.

As described above, when at least two memory access requests are simultaneously received, at least two ports may be respectively assigned in response to the rising edge and the falling edge of a clock signal, respectively, to provide a multi port function, e.g., a dual port function, according to some embodiments of the present invention. Accordingly, in some embodiments of the invention, a dual port function of a memory device may be implemented without increasing the number of the pins of the memory device as compared to a conventional memory device. Thus, the power consumption of a memory device according to some embodiments of the invention may be reduced.

While the present invention has been described with reference to the example embodiments, it will be apparent to those skilled in the art that various changes and modifications may be made without departing from the spirit and scope of the invention as defined in the following claims.

What is claimed is:

1. A memory device comprising:
    a memory cell array having a first port and a second port; and
    a switching unit configured to assign first data received through a data bus to the first port in response to a leading edge of a clock signal and configured to assign second data received through the data bus to the second port in response to a trailing edge of the clock signal;
    wherein the switching unit is further configured to selectively adjust frequencies of assigning the data to the first port and the second port on the basis of a first bandwidth and a second bandwidth provided for the first port and the second port, respectively.

2. The memory device of claim 1, wherein, in a write operation, the switching unit is configured to provide a write command and/or an address received through a command/address bus to the first port in response to the leading edge of the clock signal and to assign the data received through the data bus to the first port in response to the leading edge of the clock signal.

3. The memory device of claim 1, wherein, in a write operation, the switching unit is configured to provide a write command and/or an address received through a command/address bus to the second port in response to the trailing edge of the clock signal and to assign the data received through the data bus to the second port in response to the trailing edge of the clock signal.

4. The memory device of claim 1, wherein, in a read operation, the switching unit is configured to provide the first data to the data bus from the first port in response to the leading edge of the clock signal.

5. The memory device of claim 4, wherein, in a read operation, the switching unit is configured to provide the second data to the data bus through the second port in response to the trailing edge of the clock signal.

6. The memory device of claim 1, wherein the switching unit is configured to adjust a first frequency of assigning the data to the first port to be larger than a second frequency of assigning the data to the second port, when the first bandwidth is larger than the second bandwidth.

7. A memory device comprising:
    a memory cell array having a first port and a second port; and
    a switching unit configured to assign first data received through a data bus to the first port in response to a leading edge of a clock signal and configured to assign second data received through the data bus to the second port in response to a trailing edge of the clock signal;
    wherein the switching unit is further configured to receive a control signal indicative of a single port mode and/or a multi-port mode, and the switching unit is further configured to assign the data to the first port and the second port in response to the leading edge and the trailing edge of the clock signal, respectively, when the control signal is indicative of the multi-port mode.

8. The memory device of claim 1, further comprising:
    a first path through which the first data are transmitted to the first port of the memory cell array;
    a second path through which the second data are transmitted to the second port of the memory cell array;
    wherein the first path includes a first command/address buffer and a first data buffer between the switching unit and the memory cell array; and
    wherein the second path includes a second command/address buffer and a second data buffer between the switching unit and the memory cell array.

9. A memory device comprising:
    a switching unit configured to switch a data bus to a first path in response to a leading edge of a clock signal and configured to switch the data bus to a second path in response to a trailing edge of the clock signal; and
    a memory cell array coupled to the first path and the second path and configured to store data received from the first and second paths;
    wherein the switching unit is further configured to selectively adjust frequencies of switching the data bus to the first path and the second path on the basis of a first bandwidth and a second bandwidth provided for the first path and the second path, respectively.

10. A memory device configured to communicate with a control unit, the memory device comprising:
    a command/address bus configured to receive a command and/or an address from the control unit;
    a data bus configured to communicate data between the control unit and the memory device;
    a clock signal pin configured to receive a clock signal from the control unit;
    a switching unit configured to assign first data received through the data bus to a first port in response to a leading edge of the clock signal and to assign second data received through the data bus to a second port in response to a trailing edge of the clock signal;

a first path through which first data assigned to the first port are transmitted;

a second path through which second data assigned to the second port are transmitted;

a memory cell array configured to store the first data and the second data received respectively through the first path and the second path; and a control pin for receiving a control signal indicative of a single port mode and/or a dual port mode.

11. A method of operating a memory device in a dual port mode, the method comprising:

assigning first data received through a data bus to a first port in response to a leading edge of a clock signal and assigning the second data received through the data bus to a second part in response to a trailing edge of the clock signal when requests to access the memory device are received from at least two controllers;

providing first data assigned to the first port to a memory cell array via a first path; and providing second data assigned to the second port to the memory cell array via a second path;

wherein assigning data to the first and second ports includes adjusting frequencies of assigning the data to the first port and the second port on the basis of a first bandwidth and a second bandwidth provided respectively at the first port and the second port.

12. The method of claim 11, wherein assigning data to the first port includes providing a write command and/or an address received through a command/address bus to the first path in response to the leading edge of the clock signal in a write operation.

13. The method of claim 11, wherein assigning data to the second port includes providing a write command and/or an address received through a command/address bus to the second path in response to the tailing edge of the clock signal in a write operation.

14. The method of claim 12, wherein assigning data to the first and second ports includes adjusting a first frequency of assigning the data to the first port to be larger than a second frequency of assigning the data to the second port when the first bandwidth is larger than the second bandwidth.

15. The method of claim 11, further comprising:

assigning first data stored in a memory cell array to a first port in response to a leading edge of a clock signal and assigning second data stored in the memory cell array to a second port in response to a trailing edge of the clock signal when requests to access the memory cell array are received from at least two controllers;

providing the first data received from the first port to a data bus via a first path; and providing the second data received from the second port to the data bus via a second path.

* * * * *

UNITED STATES PATENT AND TRADEMARK OFFICE
CERTIFICATE OF CORRECTION

PATENT NO.        : 7,286,415 B2
APPLICATION NO. : 11/258766
DATED             : October 23, 2007
INVENTOR(S)       : Kwon Page 1 of 1

It is certified that error appears in the above-identified patent and that said Letters Patent is hereby corrected as shown below:

Column 11, Line 15 Claim 11:   Please correct "a second part"
                               To read -- a second port --

Column 12, Line 7 Claim 13:  Please correct "to the tailing"
                             To read -- to the trailing --

Signed and Sealed this

Twenty-fifth Day of December, 2007

JON W. DUDAS
*Director of the United States Patent and Trademark Office*